(12) United States Patent
Harvey

(10) Patent No.: US 9,529,063 B2
(45) Date of Patent: Dec. 27, 2016

(54) MR RECEIVE COIL PLATFORM WITH SELECTIVE ENGAGEMENT BETWEEN RECEIVE COIL AND PATIENT TABLE TOP

(75) Inventor: Paul Royston Harvey, Best (GB)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 474 days.

(21) Appl. No.: 14/240,966

(22) PCT Filed: Aug. 23, 2012

(86) PCT No.: PCT/IB2012/054256
§ 371 (c)(1),
(2), (4) Date: Feb. 25, 2014

(87) PCT Pub. No.: WO2013/035003
PCT Pub. Date: Mar. 14, 2013

(65) Prior Publication Data
US 2014/0218030 A1    Aug. 7, 2014

Related U.S. Application Data

(60) Provisional application No. 61/531,785, filed on Sep. 7, 2011.

(51) Int. Cl.
| | |
|---|---|
| *G01V 3/00* | (2006.01) |
| *G01R 33/30* | (2006.01) |
| *G01R 33/34* | (2006.01) |
| *G01R 33/48* | (2006.01) |
| *G01R 33/36* | (2006.01) |

(52) U.S. Cl.
CPC ......... *G01R 33/30* (2013.01); *G01R 33/34007* (2013.01); *G01R 33/48* (2013.01); *G01R 33/36* (2013.01)

(58) Field of Classification Search
USPC ......................................... 324/309
See application file for complete search history.

(56) References Cited

U.S. PATENT DOCUMENTS 5,221,902 A * 6/1993 Jones ............... G01R 33/34061
324/318
5,261,403 A * 11/1993 Saito ................ G01R 33/34061
324/318

(Continued)

FOREIGN PATENT DOCUMENTS

| CN | 201004083 Y | 1/2008 |
| JP | 11128201 A | 5/1999 |

(Continued)

*Primary Examiner* — Rodney Fuller

(57) ABSTRACT

A subject support (22) of a magnetic resonance (MR) system (10) includes a table top (20) supported by a support structure (24) and configured to move in and out of an examination volume (14). The subject support (22) further includes a coil connector (34) connected with a local receive coil (32). The coil connector (34) moves between an engaged position in which the coil connector (34) and the local receive coil (32) engage and move with the table top (20) in and out of the examination volume (14) and a disengaged position in which the coil connector (34) and the local receive coil (32) remain stationary out of the examination volume (14) as the table top (20) moves in and out of the examination volume (14).

15 Claims, 4 Drawing Sheets

(56) References Cited

U.S. PATENT DOCUMENTS

| | | | |
|---|---|---|---|
| 5,477,146 A * | 12/1995 | Jones | G01R 33/34046 |
| | | | 324/318 |
| 8,193,811 B2 * | 6/2012 | Tropp | G01R 33/3415 |
| | | | 324/318 |
| 2006/0241393 A1 | 10/2006 | Liu et al. | |
| 2008/0088309 A1 | 4/2008 | Eberler et al. | |
| 2008/0129293 A1 | 6/2008 | Schnell et al. | |
| 2009/0027053 A1 * | 1/2009 | Decke | A61B 5/0555 |
| | | | 324/318 |
| 2011/0169489 A1 | 7/2011 | Leussler | |
| 2012/0059242 A1 * | 3/2012 | Caruba | A61B 5/0035 |
| | | | 600/411 |
| 2013/0184563 A1 * | 7/2013 | Driemel | A61B 5/0555 |
| | | | 600/415 |
| 2013/0225980 A1 * | 8/2013 | Biber | A61B 5/055 |
| | | | 600/422 |
| 2014/0148686 A1 * | 5/2014 | Thevathasan | A61B 5/6835 |
| | | | 600/415 |
| 2015/0087966 A1 * | 3/2015 | Anderson | A61B 5/0002 |
| | | | 600/415 |
| 2015/0293188 A1 * | 10/2015 | Haider | G01R 33/34007 |
| | | | 324/307 |
| 2016/0195594 A1 * | 7/2016 | Leussler | A61B 5/704 |
| | | | 600/422 |

FOREIGN PATENT DOCUMENTS

| | | |
|---|---|---|
| JP | 2008154933 A | 7/2008 |
| WO | 20090146522 A1 | 12/2009 |

\* cited by examiner

MR RECEIVE COIL PLATFORM WITH SELECTIVE ENGAGEMENT BETWEEN RECEIVE COIL AND PATIENT TABLE TOP

CROSS-REFERENCE TO PRIOR APPLICATIONS

This application is the U.S. National Phase application under 35 U.S.C. §371 of International Application No. PCT/IB2012/054256, filed on Aug. 23, 2012, which claims the benefit of U.S. Provisional Patent Application No. 61/531,785, filed on Sept. 7, 2011. These applications are hereby incorporated by reference herein.

The present application relates generally to magnetic resonance (MR) systems, such as MR imaging (MRI) and MR spectroscopy (MRS) systems. It finds particular application in conjunction with handling receive coils and will be described with particular reference thereto. However, it is to be understood that it also finds application in other usage scenarios and is not necessarily limited to the aforementioned application.

MR systems often make use of external, application specific receive coils which are placed on and/or around a subject during data acquisition. Applications include, for example, brain, NV, spine, torso and musculoskeletal studies. One challenge with external receive coils is that handling the external receive coils can be time consuming and burdensome for clinicians. Cables can get in the way of clinicians and/or become tangled during positioning of the receive coils and/or data acquisition. Further, non-uniform connectors for anterior and posterior receive coils can cause problems while connecting the receive coils. Clinicians may need to seek out appropriate converters between different connector types. Given this challenge, there is growing trend towards improving the ease with which receive coils are handled in MR systems.

One approach to ease receive coil handling is to employ a receive coil fixed inside the scanner bore of an MR system which travels over the subjects as they move through the scanner bore. Other approaches employ a receive coil fixed above the subject which travels with the subject as they move through the scanner bore. However, a permanent receive coil inside the scanner bore that moves in sympathy with the patient has a number of downsides. Such a receive coil reduces the scanner bore diameter, which reduces comfort of the subject. This is especially true for those who are claustrophobic. Further, ensuring the receive coil doesn't collide with the subject requires significant mechanical control and intelligence. Even more, storing the receive coil against an existing transmit coil causes difficulties with respect to adequate radio frequency (RF) isolation and prevention of interference with the transmit coil.

The present application provides new and improved systems and methods which overcome the above-referenced problems and others.

In accordance with one aspect, a subject support for a magnetic resonance (MR) system is provided. The subject support includes a table top supported by a support structure and configured to move in and out of an examination volume. The subject support further includes a coil connector connected with a local receive coil. The coil connector moves between an engaged position in which the coil connector and the local receive coil engage and move with the table top in and out of the examination volume and a disengaged position in which the coil connector and the local receive coil remain stationary out of the examination volume as the table top moves in and out of the examination volume.

In accordance with another aspect, a magnetic resonance (MR) system is provided. The MR system includes a subject support. The subject support includes a table top supported by a support structure and configured to move in and out of an examination volume. The subject support further includes a coil connector connected with a local receive coil. The coil connector moves between an engaged position in which the coil connector and the local receive coil engage and move with the table top in and out of the examination volume and a disengaged position in which the coil connector and the local receive coil remain stationary out of the examination volume as the table top moves in and out of the examination volume. The MR system further includes an MR scanner defining the examination volume.

In accordance with another aspect, a method for MR data acquisition is provided. The method uses a subject support including a table top supported by a support structure and configured to move in and out of an examination volume. The subject support further includes a coil connector connected with a local receive coil. The coil connector moves between an engaged position in which the coil connector and the local receive coil engage and move with the table top in and out of the examination volume and a disengaged position in which the coil connector and the local receive coil remain stationary out of the examination volume as the table top moves in and out of the examination volume. The method includes positioning a subject on the table top and positioning the local receive coil on and/or over the subject. The coil connector is then moved to the engaged position. Further, the table top, the coil connector, and the local receive coil are moved into the examination volume. Data is then acquired from the receive coil.

One advantage is the ease with which external receives coils are handled.

Another advantage is that external receive coil cables are kept out of the way of clinicians.

Another advantage is that external receive coils are permanently connected.

Another advantage is that external receive coils are stored with the subject table.

Another advantage is that external receive coils do not obstruct the scanner bore.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
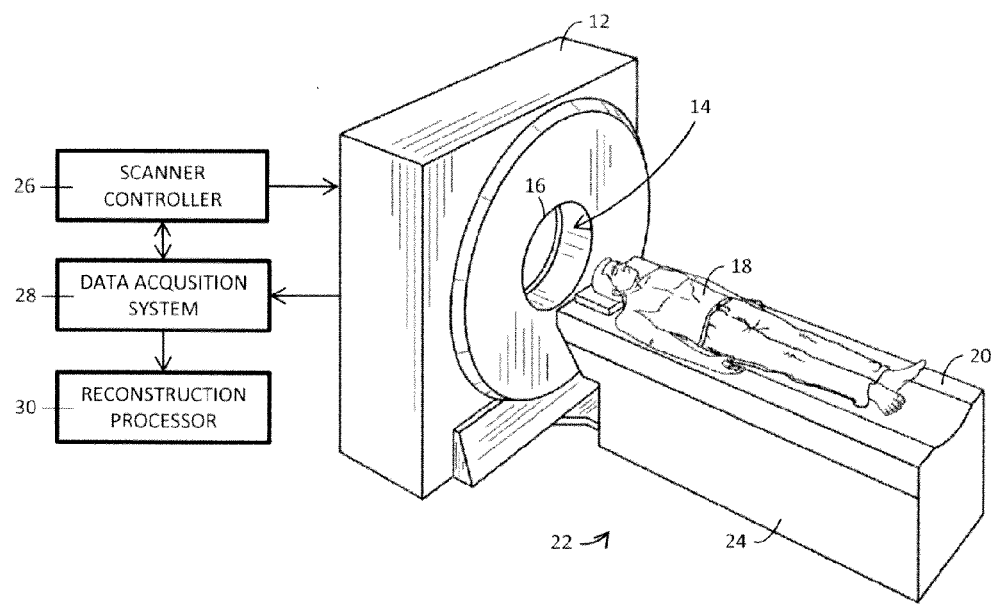
FIG. 1 is a perspective view of a magnetic resonance (MR) system.

With reference to FIG. 1, a magnetic resonance (MR) system 10 includes a scanner housing 12. The scanner housing 12 houses a main magnet which creates a strong, static $B_0$ magnetic field in an examination volume 14. The strength of the static $B_0$ magnetic field is commonly one of 0.23 Tesla, 0.5 Tesla, 1.5 Tesla, 3 Tesla, 7 Tesla, and so on in the examination volume 14, but other strengths are contemplated. The examination volume 14 is typically disposed in a scanner bore 16 sized to accommodate a subject 18 and a movable table top 20 of a subject table 22. The table top 20 supports the subject 18 and, during data acquisition, moves into the scanner bore 16. A support structure 24 of the subject table 22, which is positioned adjacent the scanner bore 16, supports the table top 20.

A plurality of gradient coils superimpose magnetic field gradients, such as x, y and z gradients, on the static $B_0$ magnetic field in the examination volume 14. Further, at least one transmit coil, such as a whole body coil, transmits $B_1$ resonance excitation and manipulation radio frequency (RF) pulses, typically of short duration, into the examination volume 14. The $B_1$ pulses excite hydrogen dipoles to resonance and the magnetic field gradients encode spatial information in the frequency and phase of a magnetic resonance signal emitted by the hydrogen dipoles in response to the excitation pulses. During data acquisition, a scanner controller 26 controls the magnetic field gradient coils and/or the transmit coil to generate any of a plurality of MR sequences, such as echo planar imaging, echo volume imaging, gradient and spin echo imaging, fast spin echo imaging, and the like. The magnetic field gradient coils and/or the transmit coil are disposed on or, more typically, in the scanner housing 12 surrounding the bore.

A plurality of receive coils receive spatially encoded magnetic resonance signals during data acquisition. The spatially encoded magnetic resonance signals are demodulated by a data acquisition system 28, typically including one or more of a preamplifier, a matching circuit and a receiver for each of the receive coils, and employed for image reconstruction by a reconstruction processor 30. Substantially any number of receive coils can be used and the receive coils can have substantially any spatial arrangement. In parallel imaging, such as SENSE, 8, 16 or more receive coils are positioned circumferentially around the scanner bore 16. The receive coils include one or more removable, local receive coils 32, shown in FIGS. 2-7, which are positioned on the subject 18, and optionally include one or more receive coils on or in the scanner housing 12. One type of local receive coil is an anterior receive coil, but other types of local receive coils, such as a posterior receive coil, a head coil, a spine coil, a knee or other joint coil, and the like, are contemplated.

In order to ease the handling of the local receive coils 32, the local receive coils 32 are permanently connected to the subject table 22 via corresponding coil connectors 34, as shown in FIGS. 2-7. Each coil connector 34 allows a clinician to selectively engage the corresponding local receive coil 32 (i.e., connect the corresponding local receive coil 32 to the data acquisition system 28), and is typically one or more of galvanic, analog, digital, and fiber optic. When a local receive coil 32 is engaged, the corresponding coil connector 34 is both mechanically and electrically connected to the table top 20, such that the local receive coil 32 moves with the table top 20. Otherwise, the coil connector 34 is mechanically and electrically isolated from the table top 20. Advantageously, by maintaining a permanent connection to the subject table 22, clinicians do not have to go to the trouble of locating the local receive coils 32, as well as connecting the local receive coils 32 to the MR system 10.

Further, to ease the handling of the local receive coils 32, one or more storage pouches 36 are mounted to the side of the support structure 24, as shown in FIGS. 2-7. Typically, each one of the storage pouches 36 corresponds to one of the local receive coils 32. In one embodiment, the storage pouches 36 form faraday cages around the stored coil to assure RF isolation from the transmit coils. When a local receive coil 32 is engaged, the local receive coil 32 is typically positioned on and/or over the subject 18. Otherwise, the local receive coil 32 is positioned in its corresponding storage pouch 36. Advantageously, the storage pouches 36 allow convenient storage of the local receive coils 32 when not in use. Further, the storage pouches 36 ensure clinicians do not have to seek out the local receive coils 32 when use is needed.

In addition to the foregoing benefits, the coil connectors 34 and the storage pouches 36, when taken together, allow minimization of the lengths of cables and/or conductors 38 connecting the local receive coils 32 to the corresponding coil connectors 34. Since the storage pouches 36 are mounted to the side of the subject support 22 and the coil connectors 34 are also mounted to the subject support 22, the cables and/or conductors 38 need only be long enough to allow movement of the corresponding local receive coils 32 between storage positions and engaged positions on and/or above the subject 18. Hence, advantageously, tangles of cables and/or conductors are minimized and cables and/or conductors are less likely to obstruct clinicians in the performance of their duties.

Figure 2:
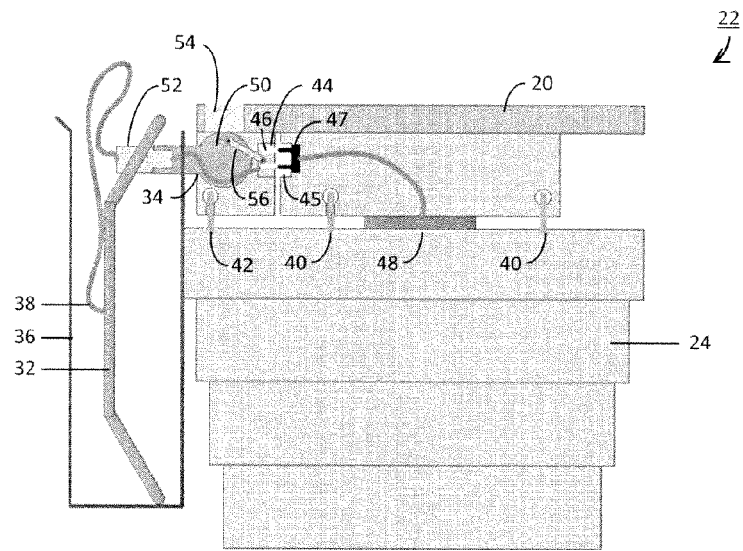
FIG. 2 is an end view of a subject table with an external receive coil in a storage position.
Figure 3:
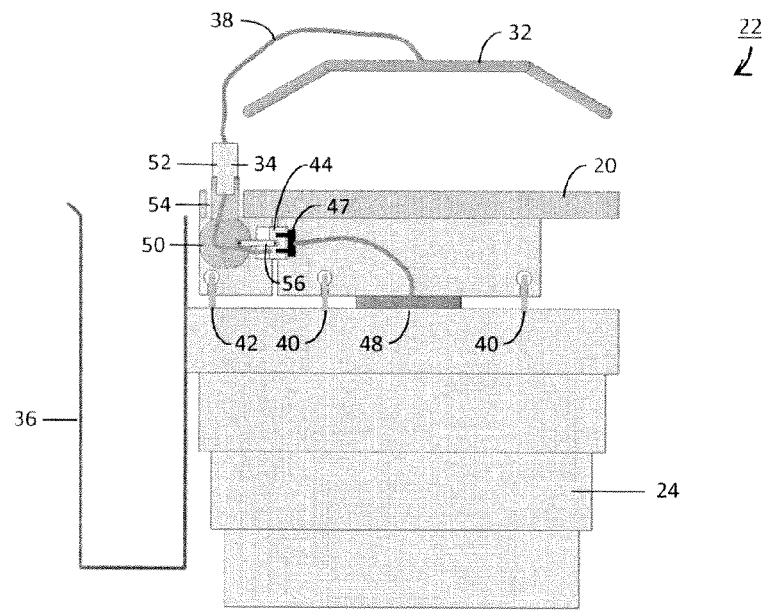
FIG. 3 is an end view of a subject table with an external receive coil in an engaged position.

With reference to FIGS. 2 and 3, the table top 20 moves along one or more travel guides 40 of the support structure 24, and the coil connectors 34 move along an independent travel guide 42. When a local receive coil 32 is engaged, the corresponding coil connector 34 moves along the independent travel guide 42 with the table top 20. Otherwise, it remains stationary with the support structure 24 as the table top 20 moves. The travel guides 40, 42 limit motion of the coil connectors 34 and the table top 20 to motion along a single axis, typically parallel to the length of the subject 18 and the axes of the scanner bore 16. In some embodiments, the table top 20 and the coil connectors 34 include rollers to facilitate motion of the coil connectors 34 and the table top 20 along the travel guides 40, 42.

Further, the coil connectors 34 include corresponding mechanical connectors 44, such as plungers 44, mating with corresponding mechanical connectors 45, such as bores, in the table top 20. When a local receive 32 coil is engaged, the mechanical connector 44 of the corresponding coil connector 34 mechanically connects the coil connector 34 to the table top 20 via a corresponding mechanical connector 45 in the table top 20. Otherwise, the coil connector 34 is mechanically disconnected from the table top 20.

In the embodiment of FIGS. 2 & 3, the mechanical connectors 44, 45 also include corresponding electrical and/or optical connectors 46, 47 that engage when the corresponding coil connectors 34 are mechanically connected to the table top 20. Suitable electrical or optical couples include a fiber optic interface, electrical pins and sockets, inductive coupling, and the like. The electrical and/or optical connectors 46, 47 carry the received magnetic resonance signals off the local coils 32 and, where appropriate, supply electrical power to the local coil 32 (e.g., to power amplifiers, analog-to-digital converters, electrical to optical connectors, and the like).

The electrical and/or optical connectors 47 of the table top 20 are connected to the data acquisition system 28 via a cable management system 48. The cable management system 48 ensures the electrical and/or optical connectors 47 of the table top 20 remain connected to the data acquisition system 28 as the table top 20 moves. For example, the cable management system 48 can include a cable and/or conductor system connecting the electrical and/or optical connectors 47 of the table top 20 to the data acquisition system 28. The cable and/or conductor system includes a cable take-up system, such as a spring loaded spindle around which the cable is wrapped. As the table top 20 moves into the scanner bore 16, the cable take-up system plays out the cable and when the table top 20 moves out of the scanner bore 16, the cable take-up system retracts the excess cable.

In some embodiments, the coil connectors 34 each include a corresponding cylindrical portion 50 and a corresponding arm 52 extending from the cylindrical portion 50 in directions perpendicular to the axis of the cylindrical portion 50. The axis of the cylindrical portion 50 is parallel to the axis along which the table top 20 travels in and out of the scanner bore 16. Further, the coil connectors 34 include corresponding notches 54 in the table top 20 that mechanically mate with the arms 52. The coil connectors 34 further include corresponding connecting rods 56 which move the mechanical connectors 44 of the coil connectors 34 into inter connection with the table mechanical connectors 45 and electrical and/or optical connectivity between the electrical connectors 46 of the coil connectors 34 and the corresponding electrical connectors 47 of the table top 20. In one embodiment, the connecting rods 56 are configured in an over center arrangement to bias the coil connector mechanical connectors 44 to stay engaged with the table top mechanical connectors 45.

When a local receive coil 32 is disengaged, as shown in FIG. 2, the corresponding coil connector 34 is in a generally horizontal position. To engage the local receive coil 32, the corresponding coil connector 34 is rotated approximately 90 degrees about the axis of the cylindrical portion 50 to a generally vertical position, as shown in FIG. 3. As the coil connector 34 rotates, the arm 52 extending from the cylindrical portion 50 mechanically engages the corresponding notch 54 in the table top 20. Advantageously, when a coil connector 34 is mechanically engaged, the coil connector 34 moves with the table top 20 along the travel guide 40 of the coil connectors 34.

Further, as the coil connector 34 rotates, the mechanical connector 44 and the electrical and/or optical connector 46 of the coil connector 34 electrically engage the corresponding mechanical connector 45 and the corresponding electrical and/or optical connector 47 of the table top 20. One end of the connecting rod 56 is rotably connected to the periphery of the cylindrical portion 50 along an axis parallel to the axis of the cylindrical portion 50, and the other end of the connecting rod 56 is rotably connected to the mechanical connector 44 of the coil connector 34 along an axis parallel to the axis of the cylindrical portion 50. When the coil connector 34 rotates between horizontal and vertical positions, the connecting rod 56 causes the mechanical connector 44 and the electrical and/or optical connector 46 of the coil connector 34 to reciprocate, electrically and/or optically and mechanically connect with the connectors 45, 47 of the table top 20.

It is to be appreciated that the rotatory embodiment of the coil connectors 34 is just for illustrative purposes. Variations are contemplated. For example, although the coil connectors 34 rotate about an axis parallel to the axis along which the table top 20 moves in and out of the scanner bore 16, the coil connectors 34 can also be rotated about an axis parallel to the axis along which the table top 20 moves. Further, embodiments of the coil connector 34 which do not require rotary motion are contemplated.

Figure 4:
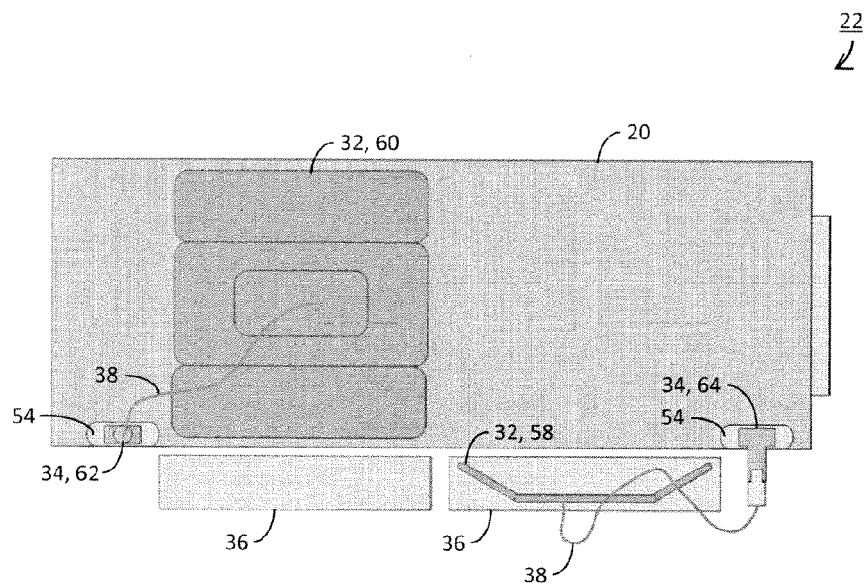
FIG. 4 is a top plan view of a subject table.
Figure 5:
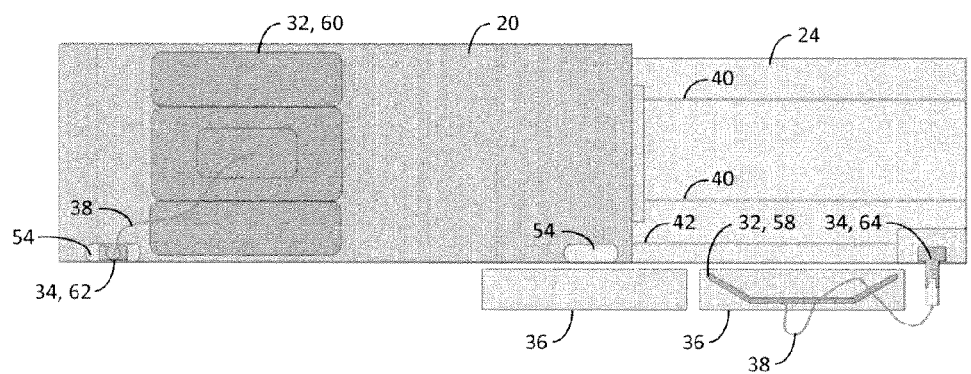
FIG. 5 is a top plan view of a subject table with the table top extended.

With reference to FIGS. 4 and 5, the motion of the table top 20 is illustrated. Typically, this motion would be into the scanner bore 16. However, for ease of illustration, the scanner bore 16 is not shown. The local receive coils 32 include a stored anterior coil 58 and a deployed anterior coil 60. In the case of the deployed anterior coil 60, the corresponding coil connector 62 is rotated to the vertical position and engages with the table top 20 such that it travels with the table top 20 into the scanner bore 16. The coil connector 64 corresponding to the stored anterior coil 58 remains behind as the table top 20 travels into the scanner bore 16.

Figure 6:
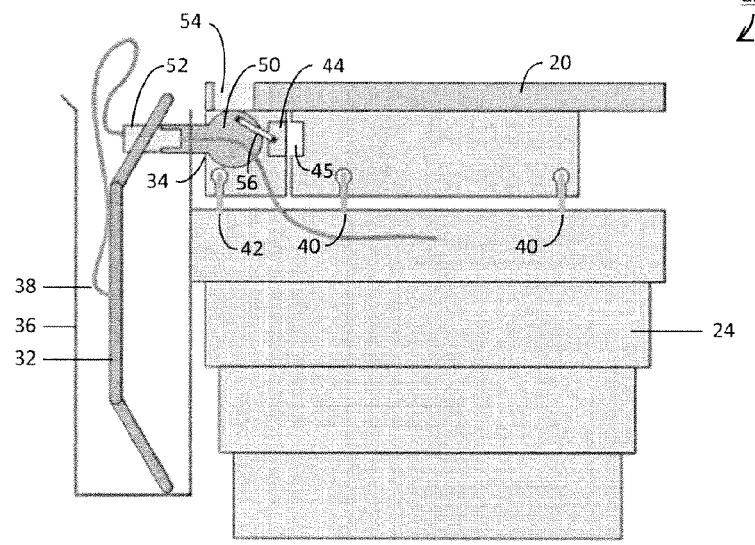
FIG. 6 is an end view of a subject table with another embodiment of the external receive coil in a storage pouch.
Figure 7:
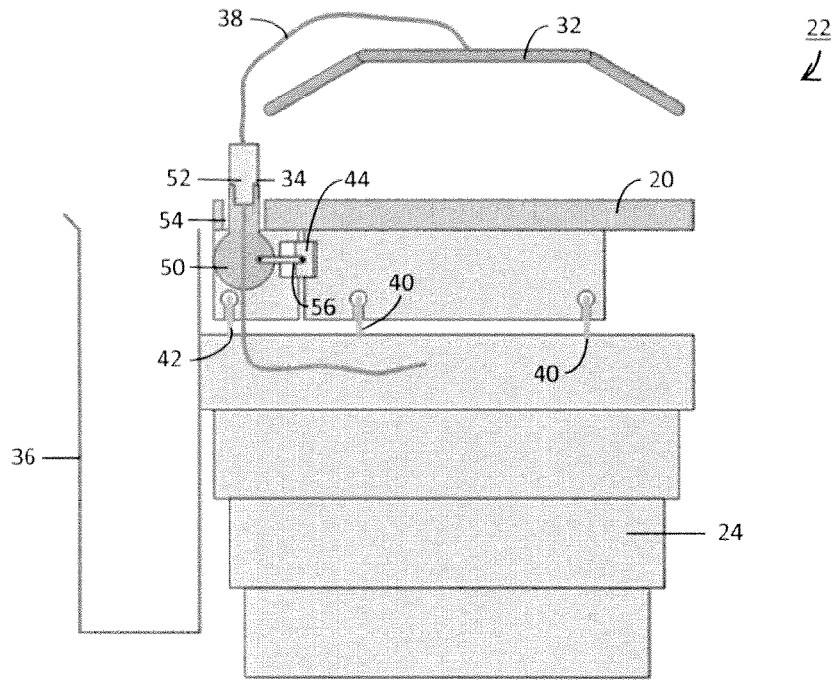
FIG. 7 is an end view of a subject table with another embodiment of the external receive coil in an engaged position.

With reference to FIGS. 6 and 7, another embodiment of the subject table 22 is illustrated. This embodiment is to be contrasted with the embodiment of FIGS. 2 and 3. Notably, the cable management system 48 is not included. Further, the electrical and/or optical connectors 46, 47 are not included. Instead, the coil connectors 34 are connected to the data acquisition system 28 via the support structure 24 at all times. In some embodiments, a cable management system connecting the coil connectors 34 and the support structure 24 is employed. It is contemplated that this cable management system can be similar to the cable management system 48 described above.

Figure 8:
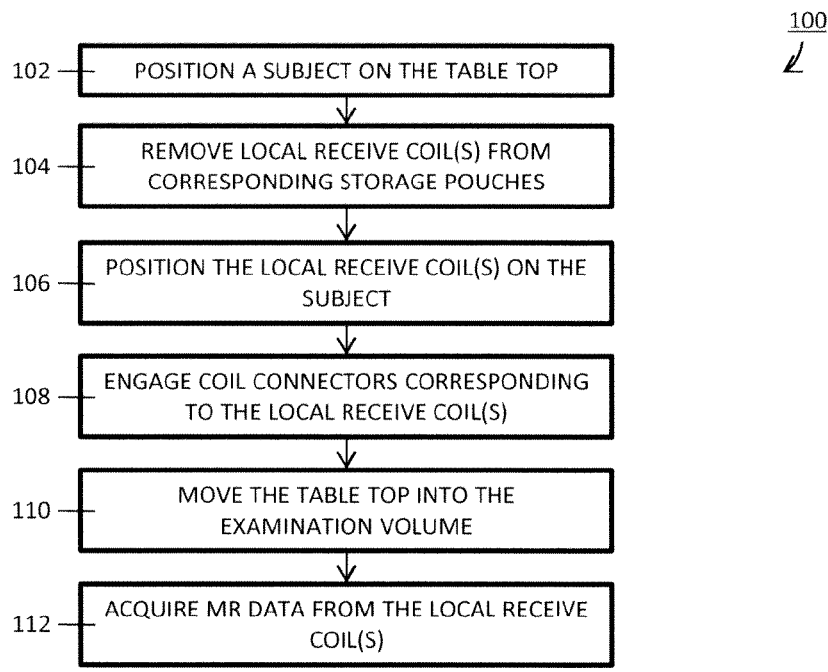
FIG. 8 is a block diagram of a method for MR data acquisition.

With reference to FIG. 8, a method 100 for magnetic resonance data acquisition is illustrated. The subject 18 is positioned 102 on the table top 20. Thereafter, one or more of the local receive coils 32 are removed 104 from their respective storage pouches 36 and positioned 106 on and/or over the subject 18. The coil connectors 34 corresponding to the deployed local receive coils 32 are then engaged 108. In some embodiments, engaging includes rotating the coil connectors 34 approximately 90 degrees from generally horizontal positions to generally vertical positions. This, in turn, establishes an electrical and/or optical conduction path between the coil connectors 34 and the table top 20, as well as mechanically connects the coil connectors 34 to the table top 20. The table top 20, the deployed local receive coils 32, and the deployed coil connectors 34 are moved 110 into the examination volume 14, typically by sliding and/or rolling along the travel guides 40, 42. MR data is then acquired 112 from the local receive coils 32, as well as position or other receive coils (not shown), by transmitting RF excitation and manipulation pulses to the examination volume 14 and creating magnetic field gradients in the examination volume 14.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A subject support for a magnetic resonance (MR) system comprising:
   a table top supported by a support structure and configured to move in and out of an examination volume; and,
   a coil connector connected with a local receive coil, the coil connector moving between an engaged position in which the coil connector and the local receive coil engage and move with the table top in and out of the examination volume and a disengaged position in which the coil connector and the local receive coil remain stationary out of the examination volume as the table top moves in and out of the examination volume.

2. The subject support according to claim 1, further including:
one or more travel guides along which the table top travels in and out of the examination volume; and,
an independent travel guide along which the coil connector travels when in the engaged position.

3. The subject support according to claim 1, wherein the coil connector mechanically and electrically connects with the table top only in the engaged position.

4. The subject support according to claim 1, wherein the coil connector rotates between a horizontal position and a vertical position, the horizontal position disengaging the coil connector and the vertical position engaging the coil connector.

5. The subject support according to claim 1, wherein an arm of the coil connector mates with a corresponding notch in the table top when the coil connector is in the engaged position.

6. The subject support according to claim 1, wherein an electrical and/or optical connector of the coil connector mates with a corresponding electrical and/or optical connector of the table top when the coil connector is in the engaged position.

7. The subject support according to claim 1, further including:
a storage pouch which stores the local receive coil when the coil connector is in the disengaged position.

8. The subject support according to claim 1, wherein the receive coil is permanently connected to the subject support.

9. A magnetic resonance (MR) system comprising:
the subject support according to claim 1; and,
an MR scanner defining the examination volume.

10. A method for MR data acquisition using the subject support according to claim 1, said method comprising:
positioning a subject on the table top;
positioning the local receive coil on and/or over the subject;
moving the coil connector to the engaged position;
moving the table top, the coil connector, and the local receive coil into the examination volume; and,
acquiring MR data from the local receive coil.

11. The method according to claim 10, further including:
removing the local receive coil from a storage pouch mounted to the side of the support structure prior to positioning the local receive coil on and/or over the subject.

12. The method according to claim 10, wherein the engaging includes:
rotating the coil connector from a generally horizontal position to a generally vertical position to cause the coil connector to engage the table top to move therewith.

13. The method according to claim 10, wherein the engaging includes:
establishing an electrical and/or optical connection path between the coil connector and the table top.

14. The method according to claim 10, wherein the engaging includes:
mechanically connecting the coil connector to the table top.

15. The method according to claim 10, wherein the moving includes:
sliding and/or rolling the table top and the coil connector into and out of the examination volume along travel guides of the support structure.

* * * * *